(12) United States Patent
Takemoto

(10) Patent No.: US 7,903,406 B2
(45) Date of Patent: Mar. 8, 2011

(54) CENTRIFUGAL FAN

(75) Inventor: Shinji Takemoto, Kyoto (JP)

(73) Assignee: Nidec Corporation, Kyoto (JP)

( * ) Notice: Subject to any disclaimer, the term of this patent is extended or adjusted under 35 U.S.C. 154(b) by 1155 days.

(21) Appl. No.: 11/483,181

(22) Filed: Jul. 10, 2006

(65) Prior Publication Data
US 2007/0020085 A1  Jan. 25, 2007

(30) Foreign Application Priority Data

Jul. 11, 2005  (JP) .................................. 2005-202324

(51) Int. Cl.
*H05K 7/20* (2006.01)
*F01D 5/08* (2006.01)
*F04B 39/06* (2006.01)

(52) U.S. Cl. ......... 361/695; 361/704; 361/719; 415/175; 415/176; 415/178; 415/203; 417/366; 417/428.8

(58) Field of Classification Search ............. 361/679.48, 361/695, 704, 717–720; 415/93, 175–176, 415/178–180, 203–204, 212.1; 417/366, 417/423.8, 423.14
See application file for complete search history.

(56) References Cited

U.S. PATENT DOCUMENTS

| | | | | |
|---|---|---|---|---|
| 4,861,237 A * | 8/1989 | Shiraki et al. | ................. | 417/353 |
| 6,021,043 A * | 2/2000 | Horng | ........................... | 361/695 |
| 6,050,785 A * | 4/2000 | Horng | ........................... | 417/354 |
| 6,109,890 A * | 8/2000 | Horng | ..................... | 417/423.14 |
| 6,132,170 A * | 10/2000 | Horng | ........................... | 415/178 |
| 6,179,561 B1 * | 1/2001 | Horng | ....................... | 415/208.3 |
| 6,400,053 B1 * | 6/2002 | Horng | ............................ | 310/91 |
| 6,509,704 B1 * | 1/2003 | Brown | ..................... | 318/400.41 |
| 6,527,522 B2 * | 3/2003 | Chen | .............................. | 417/355 |
| 6,534,722 B2 * | 3/2003 | Takaoka | ........................ | 174/254 |
| 6,754,075 B2 * | 6/2004 | Boucheret et al. | ............ | 361/697 |
| 6,841,957 B2 * | 1/2005 | Brown | ..................... | 318/400.01 |
| 7,154,750 B2 * | 12/2006 | Li et al. | ......................... | 361/695 |
| 7,329,100 B2 * | 2/2008 | Kashiwazaki et al. | ........ | 416/182 |
| 7,345,884 B2 * | 3/2008 | Horng et al. | .................. | 361/719 |
| 7,726,006 B2 * | 6/2010 | Teshima et al. | ................ | 29/596 |
| 2004/0202560 A1* | 10/2004 | Lin et al. | ..................... | 417/423.7 |
| 2007/0007834 A1* | 1/2007 | Teshima et al. | ................. | 310/71 |
| 2007/0194668 A1* | 8/2007 | Teshima et al. | ............. | 310/67 R |
| 2007/0212219 A1* | 9/2007 | Teshima et al. | .............. | 415/206 |
| 2008/0112136 A1* | 5/2008 | Lin et al. | ....................... | 361/697 |
| 2008/0219838 A1* | 9/2008 | Kusano | ........................ | 415/203 |

FOREIGN PATENT DOCUMENTS

| | | | | |
|---|---|---|---|---|
| FR | 2742813 | A1 * | 6/1997 | |
| JP | 2001135964 | A * | 5/2001 | |
| JP | 2002-291194 | A | 10/2002 | |
| JP | 2004-319949 | A | 11/2004 | |
| JP | 2009114906 | A * | 5/2009 | |

* cited by examiner

*Primary Examiner* — Robert J Hoffberg
(74) *Attorney, Agent, or Firm* — Westerman, Hattori, Daniels & Adrian, LLP

(57) ABSTRACT

A centrifugal fan includes a cylindrical housing for housing an impeller, a motor for driving the impeller and a disk-like circuit board that are arranged coaxially in an accumulated manner. When the impeller rotates, air is taken in along the axial direction of the housing and goes out through an air outlet disposed in the circumference surface of the housing. A ring-like air inlet is disposed in a wall face on one side of the housing in the axial direction. An outer rim of the circuit board that is disposed inside the wall face is substantially within the inside edge of the air inlet, and a self-heating electronic component is mounted on the circuit board at the outer edge portion. A part of air taken in from the air inlet flows at a vicinity of the electronic component so that the electronic component is cooled.

19 Claims, 5 Drawing Sheets

CENTRIFUGAL FAN

BACKGROUND OF THE INVENTION

1. Field of the Invention

The present invention relates to a centrifugal fan having a substantially cylindrical housing in which an impeller, a motor for driving the impeller and a substantially disk-like circuit board are disposed coaxially in an accumulated manner. In particular, the present invention relates to a structure for enhancing an effect of cooling a self-heating electronic component mounted on the circuit board.

2. Description of the Related Art

A cooling fan, which has a small dimensions particularly in the axial direction for a use in an electronic device, usually includes an impeller, a motor for driving the impeller and a substantially disk-like circuit board that are disposed coaxially in an accumulated manner inside a housing. On the circuit board, there is mounted a self-heating electronic component such as an integrated circuit for driving and controlling the motor. As a rotation speed of the impeller increases, a heat value of the integrated circuit also increases. In order to obtain sufficient blowing performance, it is necessary to enhance a radiation effect of the integrated circuit. Therefore, in a conventional structure, an air flow generated by rotation of the impeller is partially utilized for enhancing the radiation effect of the electronic component such as an integrated circuit.

This type of cooling fans can be roughly divided into axial fans and centrifugal fans. In an axial fan of a conventional example, the rotating impeller takes air from one side in the axial direction, and the air goes out from the other side in the axial direction. In this conventional example, The circuit board is disposed at one side in the axial direction of the impeller (an inlet side or an outlet side), and a radiator film (a conductive pattern) is arranged at the perimeter of the outer periphery of the circuit board, which is connected to a heat sink terminal of the integrated circuit. Then, a part of the air flow generated by rotation of the impeller cools the radiator film, so that a cooling effect of the integrated circuit can be enhanced.

In an axial fan of another conventional example, air is taken in through an inlet arranged at one side or inlets arranged at both sides in axial direction and sent in the circumferential direction inside the housing, and the air goes out radially (centrifugally) from an outlet disposed on the circumference surface of the housing. In this conventional example, a rectangular box-like odd housing is used, and a self-heating component is arranged at a corner of its inner space deviated from the outer rim of the impeller. Note that the circuit board also works as a wall on one side of the housing in the axial direction, and the self-heating component is mounted at a corner of the circuit board having a rectangular contour so that the structure described above is realized. A part of the air flow running through the inside space of the housing in the circumferential direction cools the self-heating component.

Although the structure described above is known as a structure for cooling a self-heating component mounted on a circuit board of a centrifugal fan, this structure has a disadvantage as follows. Firstly, if a size of the circuit board that constitutes a side face of the housing increases, the circuit board is required to have an opening corresponding to an air inlet that may be arranged on the side face. Therefore, a wasted part of the circuit board increases resulting in a disadvantage in cost. In addition, a normal centrifugal fan uses a substantially cylindrical housing whose inner space has a cross section increasing gradually in the circumferential direction toward the air outlet. However, the structure of the conventional example described above uses a rectangular box-like odd housing. Therefore, the cross section of the inner space (air flow channel) changes in the circumferential direction, so it is difficult to obtain a smooth blowing performance. In addition, since the self-heating component is disposed in the air flow channel, air turbulence tends to occur resulting in a problem of a deficient blowing performance or a noise.

SUMMARY OF THE INVENTION

A centrifugal fan according to the present invention includes an impeller including a plurality of blades arranged substantially in a circular shape around a center axis, a housing including a circumferential face that covers the circumferential contour of the impeller and a pair of wall faces arranged on both sides of the impeller in the axial direction so as to define an inner space for housing the impeller, a motor fixed to the housing for supporting the impeller in a rotatable manner and driving the impeller to rotate when being supplied with electricity, an air outlet that is a through hole formed in the circumferential face of the housing, an air inlet that is a through hole formed in at least one of the pair of wall faces of the housing, at least a part of the through hole overlapping an area in the axial direction, the area which is defined by the radially inner edges of the blades surrounding the central axis, and an electronic component fixed to the housing for constituting an electric circuit for supplying the motor with electricity, at least a part of the electronic component overlapping the air inlet in the axial direction.

According to the present invention, a part of gas taken in through the air inlet formed on at least one of the pair of wall faces of the housing flows a vicinity of the electronic component generating heat so that a cooling effect is enhanced with little influence to a blowing performance or a low noise performance. Thus, it is possible to provide a centrifugal fan having a structure in which radiation effect of a self-heating component is enhanced without sacrificing a blowing performance or a low noise performance.

Other features, elements, steps, advantages and characteristics of the present invention will become more apparent from the following detailed description of preferred embodiments thereof with reference to the attached drawings.

DESCRIPTION OF THE PREFERRED EMBODIMENTS

Hereinafter, an example of the present invention will be described in detail with reference to the attached drawings. In the following description, note that directions and positions of structural elements mean those in drawings, and they do not mean those in a state being incorporated in actual equipment.

Figure 1A:
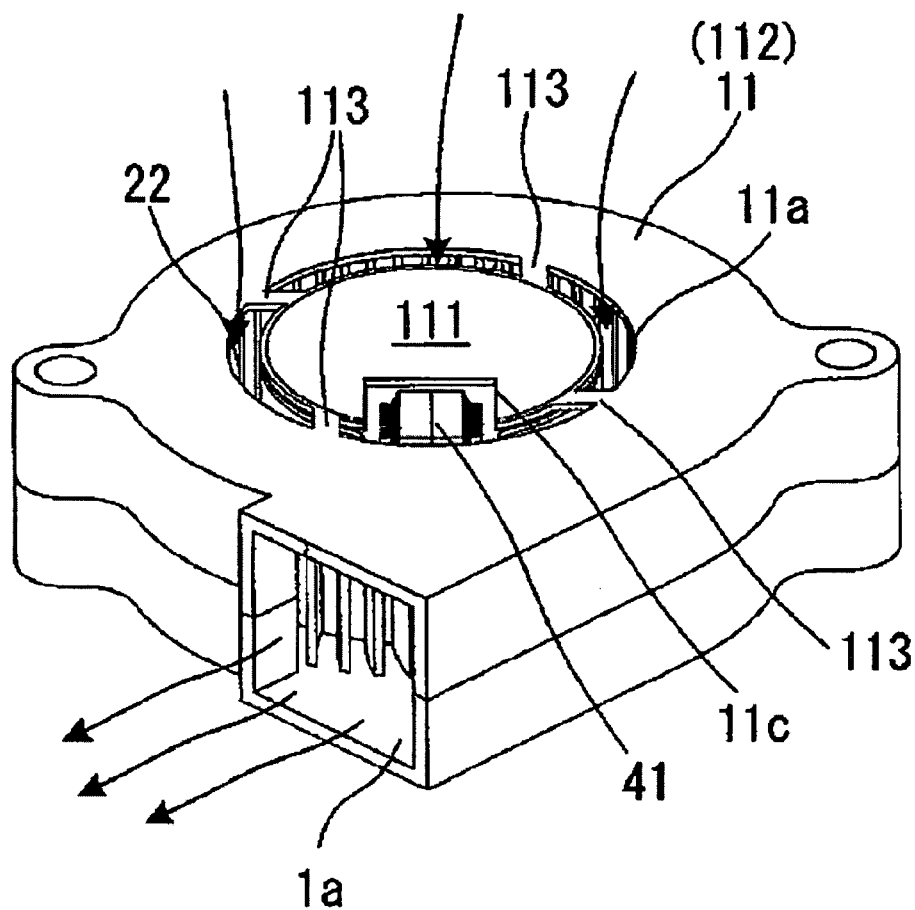
FIGS. 1A and 1B are a perspective views showing an appearance of a centrifugal fan according to an example of the present invention.
Figure 1B:
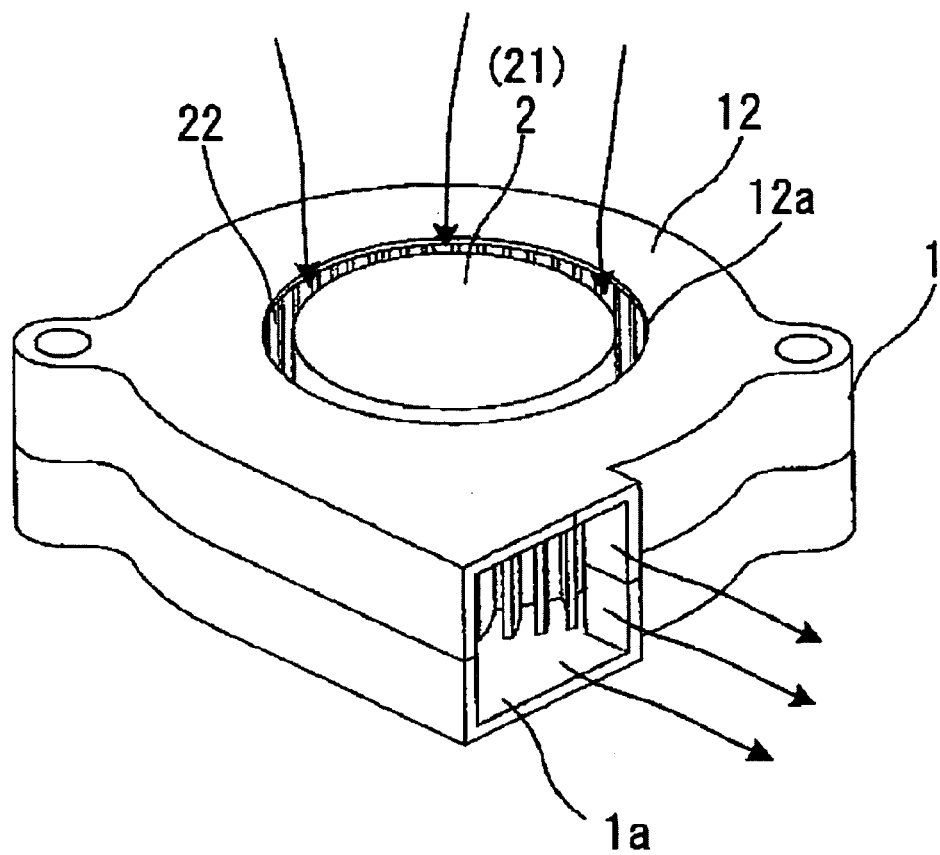
Figure 2:
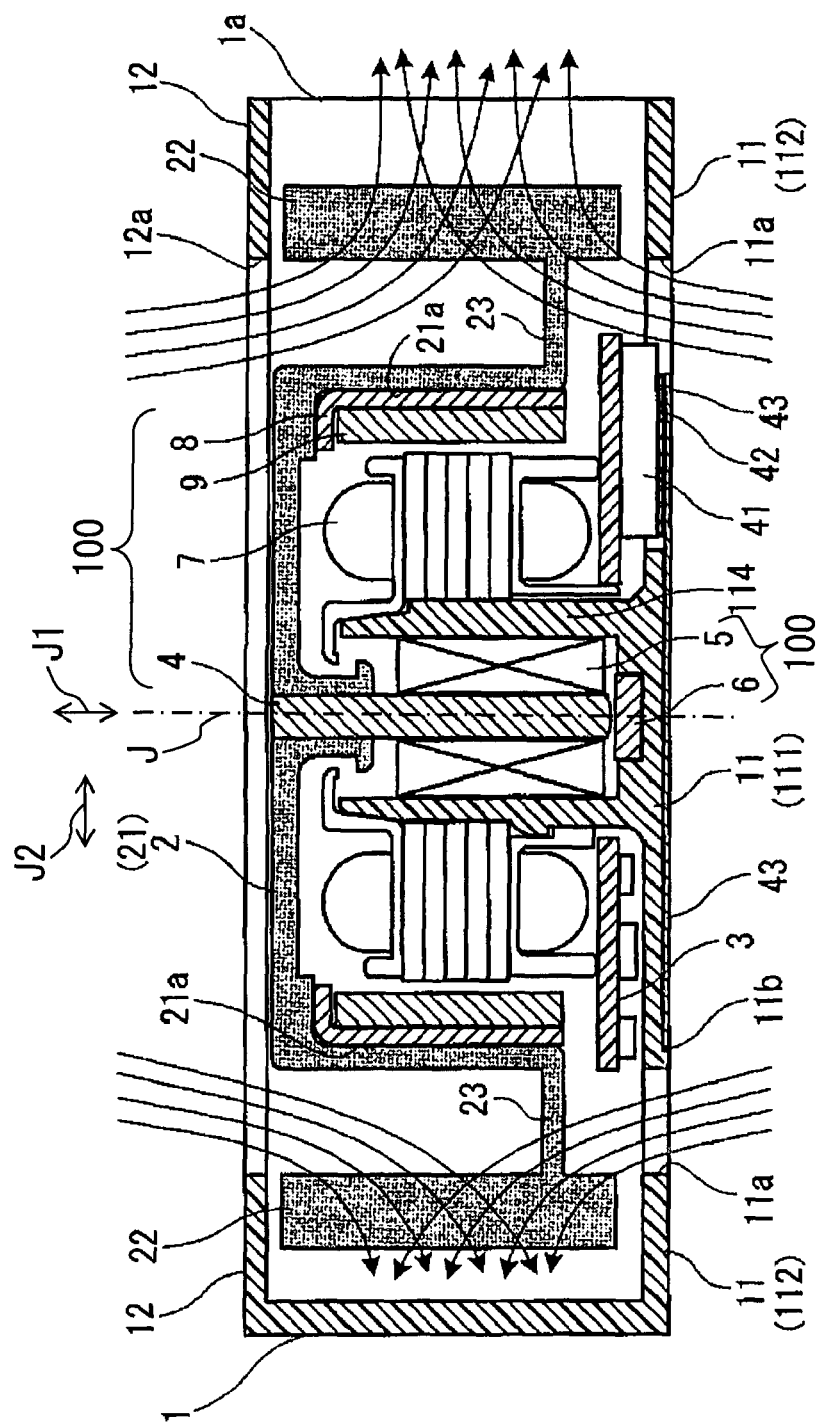
FIG. 2 is a cross sectional view of the centrifugal fan in the axial direction according to the example of the present invention.
Figure 3:
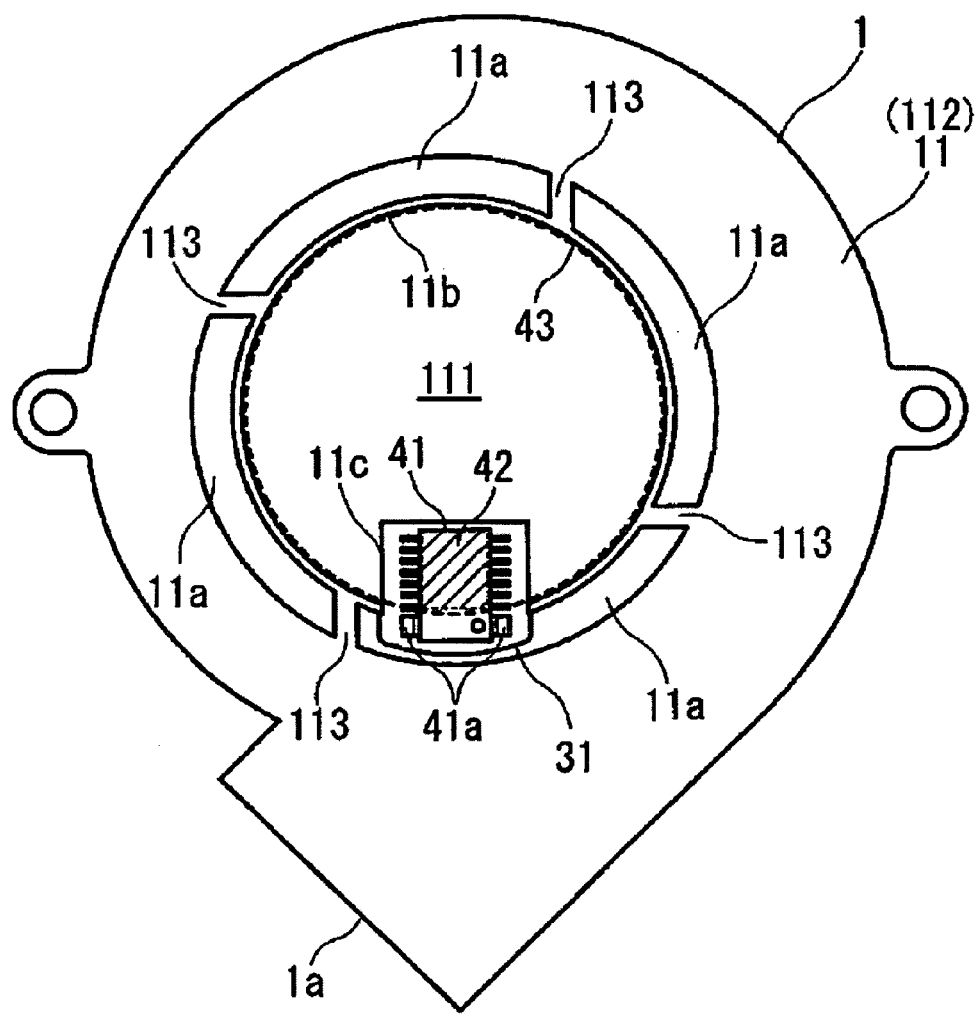
FIG. 3 is a plan view of the centrifugal fan according to the example of the present invention viewed from a proximal end in the axial direction proximal end.

FIG. 1A and 1B are perspective views showing an appearance of a centrifugal fan according to an example of the present invention. FIG. 1A is a perspective view from one side in the axial direction, while FIG. 1B is a perspective view from the other side in the axial direction. FIG. 2 is a cross sectional view of the centrifugal fan in the axial direction according to the example of the present invention. In FIG. 2, the vertical direction corresponds to the axial direction J1 of the centrifugal fan while the horizontal direction corresponds to the radial direction J2 of the centrifugal fan. The lower side in FIG. 2 corresponds to the upper side in FIG. 1A, which is referred to as a proximal end face (or an axial direction proximal end side) in the following description. The upper side in FIG. 2 corresponds to the upper side in FIG. 1B, which is referred to as a distal end face (or an axial direction distal end side) in the following description. In addition, FIG. 3 is a plan view of the centrifugal fan according to the example of the present invention viewed from a proximal end in the axial direction proximal end, and it shows a state without a circular rating plate that is stuck to the center portion.

The centrifugal fan according to this example has a structure including a substantially cylindrical housing 1, which houses an impeller 2, a motor 100 for driving the impeller 2 and a circuit board 3 having a substantially disk-like shape (more precisely a doughnut-like shape) that are arranged coaxially in an accumulated manner. The motor 100 includes a stator armature (hereinafter referred to a "stator" simply that will be described later, a rotor magnet, a rotor hub, a rotating shaft, a bearing mechanism and the like.

The housing 1 is provided with an air inlet 11a having a substantially circular shape formed in a wall face on the proximal end side in the axial direction (a proximal end face) 11 and an air inlet 12a having a circular shape formed in a wall face on the distal end side in the axial direction (a distal end face) 12 at substantially middle portion. As shown in FIG. 1A, the circular air inlet 11a is divided by four connection portion 113 in the circumferential direction. In other words, as understood from FIG. 3, a middle portion 111 and an outer portion 112 of the proximal end face 11 are connected by the four connection portion 113. Furthermore, as shown in FIG. 1B, a middle cylindrical portion 21 of the impeller 2 can be seen inside the air inlet 12a formed in the distal end face 12 of the housing 1. An air outlet 1a is formed in the circumferential face of the housing 1.

When the impeller 2 rotates, air taken in through the air inlets 11a and 12a of the housing 1 in the axial direction is sent in the circumferential direction inside the housing 1 and goes out through the air outlet 1a formed on the circumference surface of the housing 1 as shown in FIGS. 1 and 2 with arrow lines. Note that an air channel inside the housing 1 is structured in such a way that a cross section thereof increases gradually along the circumferential direction toward the air outlet 1a as shown in FIG. 3.

The impeller 2 includes an outer blade portion 22 having a plurality of blades extending in the axial direction and arranged at a constant pitch in the circumferential direction around a center axis J, the middle cylindrical portion 21 and a plurality of connection portions 23 that connect the outer blade portion 22 and the middle cylindrical portion 21. In FIGS. 1A and 1B, there can be seen a plurality of blades (lines in the axial direction) constituting the outer blade portion 22 of the impeller 2 in gaps of the air inlets 11a and 12a. A rotating shaft 4 extending from the distal end side to the proximal end side in the axial direction is fitted in the center of the middle cylindrical portion 21 and fixed to the same by means of adhesion or the like. As shown in FIG. 2, a cylindrical bearing portion 114 is provided so as to protrude from the center of the proximal end face 11 (the middle portion 111) of the housing 1, and a sleeve 5 made of a sintered metal or a ceramic impregnated with oil is fixed to the inner face of the cylindrical bearing portion 114. This sleeve 5 constitutes a radial bearing of the rotating shaft 4. In addition, a thrust plate 6 made of a metal or a ceramic is embedded in the bottom of the bearing portion 114, and the upper side of the thrust plate 6 and the proximal end face of the rotating shaft 4 are opposed to each other so that a thrust bearing is structured as shown in FIG. 2.

A stator 7 is fixed to the outer circumferential face of the bearing portion 114 protruding from the proximal end face 11 of the housing 1. In addition, a rotor yoke 8 having a substantially cylindrical shape is fitted in and fixed to the inner face 21a of the middle cylindrical portion 21 of the impeller 2, and a cylindrical rotor magnet 9 is fitted in and fixed to the inner face of the rotor yoke 8. The outer circumference surface of the stator 7 and the inner face of the rotor magnet 9 are opposed to each other with a predetermined gap.

The bearing mechanism including the bearing portion 114, the rotating shaft 4, the sleeve 5 and the thrust plate 6, the stator 7 and the rotor magnet 9 described above constitute a brushless motor. When the stator 7 of the motor is energized, a rotating magnetic field is generated so that the rotor magnet 9 is supplied with a torque. Then, the rotor magnet 9, the rotor yoke 8, the impeller 2 and the like rotate as one unit. As a result, air taken in through the air inlets 11a and 12a of the housing 1 in the axial direction is sent in the circumferential direction inside the housing 1 and goes out through the air outlet 1a formed on the circumference surface of the housing 1.

Figure 4:
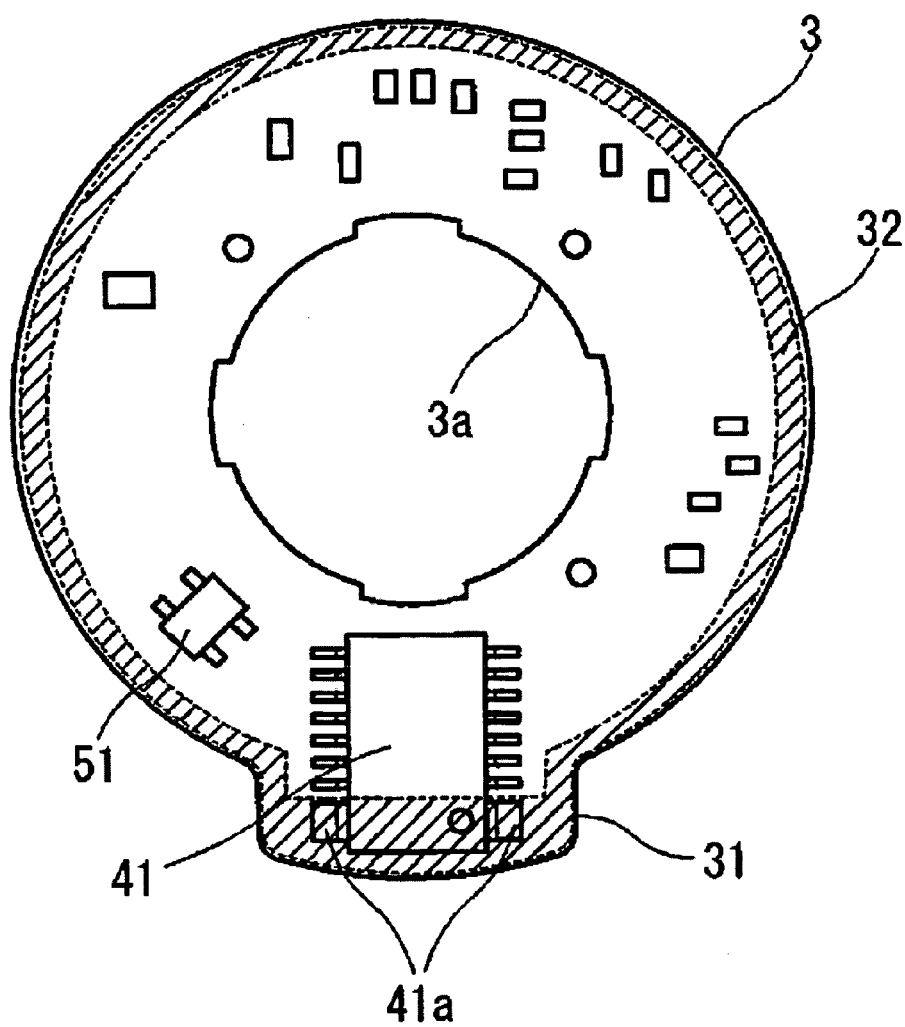
FIG. 4 is a plan view of a circuit board of the centrifugal fan according to the example of the present invention viewed from a proximal end.

FIG. 4 is a plan view of the circuit board of the centrifugal fan according to the example of the present invention viewed from the proximal end side. The circuit board 3 includes circuit patterns made of copper foil formed on a substrate made of glass, paper or the like, and the circuit board 3 is pressed in a substantially circular (doughnut-like) shape as shown in FIG. 4. A substantially circular opening 3a formed in the middle of the circuit board 3 is an opening for avoiding the bearing portion 114 protruding from the proximal end face 11 of the housing 1. As understood from FIGS. 2 and 3, the circuit board 3 is disposed inside the proximal end face 11 of the housing 1, and the outer rim thereof is substantially within the inside edge of the air inlet 11a. However, a protruding portion 31 is formed at a portion of the outer circular edge of the circuit board 3, and this protruding portion 31 is exposed to the air inlet 11a (see FIG. 3).

As shown in FIG. 4, surface-mount components such as an integrated circuit 41, a Hall device 51, chip resistors, chip capacitors and the like are mounted on the proximal end side of the circuit board 3. The Hall device 51 detects a rotation speed and a phase of the rotor of the motor, and an output signal thereof is supplied to the integrated circuit 41. The integrated circuit 41 controls and drives the motor, i.e., controls exciting current of the stator 7 based on the signal from the Hall device 51 and the like. This integrated circuit 41 is a self-heating component. As the rotation speed of the rotor increases (average exciting current increase), a heat value of the integrated circuit 41 also increases. Therefore, in order to obtain sufficient blowing performance, it is necessary to enhance a radiation performance of the integrated circuit 41.

In the centrifugal fan of this example, the radiation performance of the integrated circuit 41 is improved by some contrivances as described below. First, the integrated circuit 41 is disposed at the protruding portion 31 of the circuit board 3 so that a part of the integrated circuit 41 is exposed to the air inlet 11a as shown in FIG. 3. Therefore, it is possible to obtain a cooling effect of the integrated circuit 41 by a flow of air taking in through the inlet 11a. In addition, the integrated circuit 41 in this example has a pair of heat sink terminals 41a at one end in the longitudinal direction, so that heat generated inside the integrated circuit 41 can be dissipated externally effectively via the heat sink terminals 41a. Therefore, in this example, the integrated circuit 41 is arranged so that the heat sink terminals 41a are positioned at the outer side of the circuit board 3. Thus, the cooling effect of the integrated circuit 41 due to the flow of air taken in through the air inlet 11a is further enhanced.

As another contrivance for radiating heat of the integrated circuit 41, a radiating pattern (a conductive pattern) 32 to which the heat sink terminals 41a are soldered is formed along the outer edge of the circuit board 3 as shown in FIG. 4 with hatching. Since the air taken in through the air inlet 11a flows through a vicinity of the outer edge of the circuit board 3, heat generated inside the integrated circuit 41 can be dissipated from the heat sink terminals 41a to the radiating pattern 32 and is cooled effectively. Although the conductive pattern 32 is formed along the entire perimeter of the circuit board 3 in the example shown in FIG. 4, it is possible to form a circular arc radiating pattern along a part of the outer edge of the circuit board 3.

In addition, the position of the integrated circuit 41 on the circuit board 3 in the circumferential direction, i.e., the position of the protruding portion 31 in the circumferential direction is adapted to be close to the air outlet 1a of the housing 1 as shown in FIG. 3. In this type of centrifugal fan, a quantity of air taken in through the ring-like air inlet 11a formed on the side face in the axial direction (the proximal end face 11 in this example) becomes the largest at a position close to the air outlet 1a in the circumferential direction. Therefore, by disposing the integrated circuit 41 at this position, the cooling effect of the integrated circuit 41 due to the air taken in through the ring-like air inlet 11a can be further enhanced.

Another contrivance for radiating heat of the integrated circuit 41 is that the surface of the integrated circuit 41 is adhered to a rating plate 43 made of a thin metal plate via a adhesive tape 42 having high thermal conductivity as shown in FIGS. 2 and 3. However, FIG. 3 shows the state without the rating plate 43 though a circular contour of the rating plate 43 is shown by the broken line. A shallow circular recess 11b having a depth substantially corresponding to a thickness of the rating plate 43 is formed at the middle portion 111 on the proximal end face 11 of the housing 1, so that the rating plate 43 made of a thin plate of aluminum for example is fitted in and adhered to the circular recess 11b. A notch portion 11c having a rectangular shape is formed to cut a part of the circumference of the middle portion 111 on the proximal end face 11 of the housing 1, and this notch portion 11c avoids the integrated circuit 41 (see FIG. 3). The surface of the integrated circuit 41 and the back surface (the distal end side) of the rating plate 43 are opposed to each other with a small gap.

Therefore, the adhesive tape 42 is adhered to the surface of the integrated circuit 41, and then the rating plate 43 is adhered to the circular recess 11b formed at the middle portion 111 on the proximal end face 11 of the housing 1, so that the surface of the integrated circuit 41 and the back surface of the rating plate 43 are adhered to each other via the adhesive tape 42. In this way, heat generated in the integrated circuit 41 can be dissipated easily via the adhesive tape 42 and the rating plate 43. This, adding to the cooling effect by the flow of air taken in through the air inlet 11a described above, a natural heat sinking effect via the rating plate 43 that is a thin metal plate is obtained. As a result, heat radiation of the integrated circuit 41 is further promoted.

As described above, heat radiation of the integrated circuit 41 that is a self-heating component mounted on the circuit board 3 is promoted by the structure described above in the centrifugal fan of this example. Therefore, the blowing performance can be improved. In addition, there is no obstacle in the air flow channel inside the housing 1, so air turbulence or a noise hardly occurs. As a result, it is possible to provide a centrifugal fan having a structure in which radiation effect of a self-heating component is enhanced without sacrificing a blowing performance or a low noise performance.

Although the example and its variations of the present invention are described above, the present invention can be embodied in various ways without limited to the example and its variations. For example, the self-heating component mounted on the circuit board 3 is not limited to the integrated circuit but can be other electronic component such as a power transistor or a resistor. In addition, although a size of the self-heating component (the integrated circuit 41) is relatively large with respect to the radial size of the circuit board 3 in the example described above, there may be the case where the size of the self-heating component is relatively small. In this case, the self-heating component may be disposed at a position close to a peripheral portion of the circuit board 3, the cooling effect of the self-heating component is enhanced when air taken in through the air inlet 11 a flows near the self-heating component. In this case, it is not necessary to provide the protruding portion 31 to the outer circular edge of the circuit board 3. However, when the protruding portion 31 is provided and the self-heating component is disposed there, the cooling effect of the self-heating component can be further enhanced.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the present invention which fall within the true spirit and scope of the invention.

What is claimed is:

1. A centrifugal fan comprising: an impeller including a plurality of blades arranged substantially in a circular shape around a center axis, the center axis defining an axial direction; a housing including a circumferential face that covers the circumferential contour of the impeller and a pair of wall faces arranged on both sides of the impeller in the axial direction, the circumference face and the pair of wall faces defining an inner space for housing the impeller; a motor fixed to the housing for supporting the impeller in a rotatable manner and driving the impeller to rotate when being supplied with electricity; an air outlet that is a first through hole formed in the circumferential face of the housing; an air inlet that is a second through hole formed in at least one of the pair of wall faces of the housing, at least a part of the second through hole overlapping an area in the axial direction, the area which is defined by the radially inner edges of the plurality of blades surrounding the central axis, wherein the air inlet has a substantially ring-like shape around the center axis or a shape of part of the ring-like shape; wherein the air inlet has a notch portion at an inner circumferential portion of the second through hole, the notch portion being defined by the inner circumferential portion and extending radially inwardly; and wherein at least a part of an electronic component is accommodated in a space defined by the notch portion; and the electronic component fixed to the housing for constituting an electric circuit for supplying the motor with the electricity, at least a part of the electronic component overlapping the air inlet as viewed in the axial direction.

2. The centrifugal fan according to claim 1, wherein the at least a part of the electronic component is positioned between the air outlet and the center axis as viewed from the axial direction.

3. The centrifugal fan according to claim 2,
wherein the centrifugal fan includes a circuit board on which the electronic component is mounted, so that the electronic component is fixed to the housing via the circuit board.

4. The centrifugal fan according to claim 3, wherein the electronic component is an integrated circuit having a heat sink terminal, and at least a part of the heat sink terminal overlaps the air inlet as viewed in the axial direction.

5. The centrifugal fan according to claim 4,
wherein the circuit board has a conductive pattern on an edge portion to which the heat sink terminal of the electronic component is soldered.

6. The centrifugal fan according to claim 2, wherein at least a part of an edge of a circuit board has a circular shape having a radius that is equal to or smaller than that of the inner circumferential portion of the air inlet having the ring-like shape; a protruding portion of the circuit board protrudes outward in the radial direction from the edge of the circuit board having the circular shape portion; and at least a part of the electronic component is disposed at the protruding portion.

7. The centrifugal fan according to claim 2, wherein the electronic component is an integrated circuit having a heat sink terminal, and at least a part of the heat sink terminal overlaps the air inlet as viewed in the axial direction.

8. The centrifugal fan according to claim 1,
wherein the centrifugal fan includes a circuit board on which the electronic component is mounted, so that the electronic component is fixed to the housing via the circuit board.

9. The centrifugal fan according to claim 8, wherein the electronic component is an integrated circuit having a heat sink terminal, and at least a part of the heat sink terminal overlaps the air inlet as viewed in the axial direction.

10. The centrifugal fan according to claim 9,
wherein the circuit board has a conductive pattern on an edge portion to which the heat sink terminal of the electronic component is soldered.

11. The centrifugal fan according to claim 9, wherein the centrifugal fan has a name plate made of a thin metal plate, and the electronic component is adhered to the name plate via a thermal conductive adhesive tape.

12. The centrifugal fan according to claim 8, wherein the centrifugal fan has a name plate made of a thin metal plate, and the electronic component is adhered to the name plate via a thermal conductive adhesive tape.

13. The centrifugal fan according to claim 1, wherein at least a part of an edge of a circuit board has a circular shape having a radius that is equal to or smaller than that of the inner circumferential portion of the air inlet having the ring-like shape; a protruding portion of the circuit board protrudes outward in the radial direction from the edge of the circuit board having the circular shape portion; and at least a part of the electronic component is disposed at the protruding portion.

14. The centrifugal fan according to claim 13, wherein the electronic component is an integrated circuit having a heat sink terminal, and at least a part of the heat sink terminal overlaps the air inlet as viewed in the axial direction.

15. The centrifugal fan according to claim 14,
wherein the circuit board has a conductive pattern on an edge portion to which the heat sink terminal of the electronic component is soldered.

16. The centrifugal fan according to claim 1, wherein the electronic component is an integrated circuit having a heat sink terminal, and at least a part of the heat sink terminal overlaps the air inlet as viewed in the axial direction.

17. The centrifugal fan according to claim 16, wherein the centrifugal fan has a name plate made of a thin metal plate, and the electronic component is adhered to the name plate via a thermal conductive adhesive tape.

18. The centrifugal fan according to claim 1, wherein the centrifugal fan has a name plate made of a thin metal plate, and the electronic component is adhered to the name plate via a thermal conductive adhesive tape.

19. A centrifugal fan comprising: an impeller including a plurality of blades arranged substantially in a circular shape around a center axis, the center axis defining an axial direction; a housing including a circumferential face that covers the circumferential contour of the impeller and a pair of wall faces arranged on both sides of the impeller in the axial direction, the circumference face and the pair of wall faces defining an inner space for housing the impeller; a motor fixed to the housing for supporting the impeller in a rotatable manner and driving the impeller to rotate when being supplied with electricity; an air outlet that is a first through hole formed in the circumferential face of the housing; an air inlet that is a second through hole formed in at least one of the pair of wall faces of the housing, at least a part of the second through hole overlapping an area in the axial direction, the area which is defined by the radially inner edges of the plurality of blades surrounding the central axis, wherein the air inlet has a substantially ring-like shape around the center axis or a shape of part of the ring-like shape; wherein the air inlet has a notch portion at an inner circumferential portion of the second through hole, the notch portion being defined by the inner circumferential portion and extending radially inwardly; and wherein at least a part of an electronic component is accommodated in a space defined by the notch portion; and the electronic component fixed to the housing for constituting an electric circuit for supplying the motor with the electricity.

* * * * *